United States Patent [19]

Embree et al.

[11] Patent Number: 4,973,922

[45] Date of Patent: Nov. 27, 1990

[54] VOLTAGE CONTROLLED VARIABLE CAPACITOR AND OSCILLATOR USING IT

[75] Inventors: David M. Embree, Hampstead, N.H.; Shawn M. Logan, Andover, Mass.

[73] Assignee: AT&T Bell Laboratories, Murray Hill, N.J.

[21] Appl. No.: 455,890

[22] Filed: Dec. 26, 1989

Related U.S. Application Data

[62] Division of Ser. No. 126,132, Nov. 27, 1987, abandoned.

[51] Int. Cl.$^5$ .......................... H03B 5/36; H03J 3/18; H01L 29/94
[52] U.S. Cl. ............................ 331/108 D; 331/116 R; 331/116 FE; 331/158; 331/177 V; 357/23.6
[58] Field of Search ............. 331/36 C, 177 V, 108 C, 331/108 D, 116 FE, 116 R, 158; 357/14, 15, 23.6

[56] References Cited

U.S. PATENT DOCUMENTS

| 4,458,215 | 7/1984 | Huang et al. | 331/177 V |
| 4,518,930 | 5/1985 | Rozema et al. | 331/116 R X |
| 4,626,881 | 12/1986 | Kishi et al. | 357/23.6 |

FOREIGN PATENT DOCUMENTS

2842646  4/1980  Fed. Rep. of Germany ... 331/177 V

OTHER PUBLICATIONS

"High-Sensitivity MOS Varactor", P. R. S. Rao, K. N. Bhat and K. R. Rao, Solid-State Electronics, vol. 29, No. 11, pp. 1137-1144, 1986.
"A Frequency Adjustable Ultra-Compact, High-Performance Quartz Crystal Oscillator and its Simple Temperature Compensation Method", O. Ochiai, F. Tamura and Y. Mashimo, Seiko Electronic Components Ltd., 40th Annual Frequency Control Symposium-1986.
"Ideal MOS Curves for Silicon", A. Goetzberger, The Bell System Technical Journal, Sep. 1966, pp. 1097-1099 and pp. 1100-1122.
"Device Electronics for Integrated Circuits", Richard S. Muller and Theodore I. Kamins, John Wiley & Sons, N.Y., 1977, pp. 314-317 and 344.
"Device Electronics for Integrated Circuits", (Muller & Kamins), Solutions Manual prepared by K. C. Hsieh, J. H. Kim, B. Y. Liu, p. 99.

Primary Examiner—Siegfried H. Grimm
Attorney, Agent, or Firm—Scott W. McLellan

[57] ABSTRACT

A voltage variable capacitor (VVC) having two terminals in a variable frequency crystal oscillator integrated into a common substrate with the oscillator circuitry and isolated therefrom. The VVC is constructed using the same processing steps as the oscillator circuitry and achieves low series resistance and wide capacitance variation by utilizing a substrate or epitaxial layer (body) having a well with a diffused region therein. The region, of the same conductivity type as the well and a first one of the two terminals, forms a rectangular ring in the well. Over the region and insulated therefrom, a conductive layer is deposited to provide a second one of the two terminals. Both terminals are electrically isolated from the body.

11 Claims, 4 Drawing Sheets (NOT TO SCALE)

(NOT TO SCALE)

(NOT TO SCALE)

VOLTAGE CONTROLLED VARIABLE CAPACITOR AND OSCILLATOR USING IT

This application is a division of application Ser. No. 126,132, filed on Nov. 27, 1987 and now abandoned.

This application relates to copending application titled "High Frequency CMOS Oscillator", Ser. No. 126131, now U.S. Pat. No. 4,853,655, having the same assignee as this application and filed simultaneously herewith.

FIELD OF THE INVENTION

This invention relates generally to voltage controlled variable capacitor (VVC) devices, and more particularly, to VVC devices in combination with variable frequency oscillators, or variable frequency crystal oscillators, integrated onto a common semiconductor body.

BACKGROUND OF THE INVENTION

Variable frequency oscillators are extensively used to provide a signal with a frequency which can be varied over a predetermined range. An exemplary use for such an oscillator is in a phase phase-locked-loop where the frequency of the signal from the oscillator is forced to follow the frequency, or a multiple of the frequency, of an input signal to the phase-locked-loop by varying a voltage applied to a control input of the variable frequency oscillator. Typical variable frequency oscillators, such as voltage controlled oscillators (VCOs) or voltage controlled crystal oscillators (VCXOs), may have three separate components: a frequency determining network, a voltage controlled variable capacitor (VVC) and an oscillator circuit. The frequency determining network is either a high quality (high "Q") tank circuit, or crystal resonator, which, in combination with the VVC, determines the output frequency of the VCO or VCXO. The VVC is a two terminal device which changes its capacitance in response to an externally supplied control voltage impressed across its terminals. The change in capacitance by the VVC "pulls" the resonant frequency of the tank circuit or crystal resonator and, hence, varies the output frequency of the oscillator. The oscillator circuit is typically thought of as a two terminal (one port) circuit, utilizing bipolar or metal-oxide-semiconductor (MOS) technology, providing the necessary gain and feedback to achieve and sustain oscillation. But having a VVC separate from the oscillator circuitry increases the cost and reduces both the manufacturing yield and reliability of a variable oscillator utilizing a separate VVC.

In VCXOs, the frequency determining network, a crystal resonator, is wired in series with the VVC and the oscillator circuitry. However, the VVC is not integrated onto the same substance or epitaxial layer on a substrate (hereinafter referred to as a semiconductor body) as the oscillator circuitry since the structure of VVC of the prior art has only one terminal thereof available for coupling to the crystal or oscillator circuitry; the remaining terminal is coupled to the semiconductor body (ground). One such VVC is illustrated in "Device Electronics for Integrated Circuits", by R. S. Muller and T. I. Kamins, 1977, p. 344, FIG. P7.7(a). As shown, the VVC has one terminal thereof being the conductive region insulated from the semiconductor body by an oxide layer; the body itself being the remaining terminal. Extensive evaluation of the ideal characteristics of this type of VVC is described in "Ideal MOS Curves for Silicon", by A. Goetzberger, Bell System Technical Journal, September, 1966, pp. 1097-1122. Further, a description of the operation of a similar VVC is described in detail in "Device Electronics for Integrated Circuits" on pp. 314-317. But for purposes here the operation thereof is described briefly herein. As the voltage applied to the terminal exceeds a predetermined threshold voltage, the body directly beneath the electrode becomes depleted of carriers (depletion) and becomes non-conductive. The depth of the depletion layer varies with the voltage on the electrode; the capacitance varying inversely with the depth of the depletion region and, therefore, inversely with the applied voltage. This is analogous to the "movable" plate (the interface between the depletion layer and the undepleted portion of the body) of a mechanical air-dielectric variable capacitor varying in distance from the "fixed" plate thereof (the conductive layer). This type of VVC has the drawbacks of high series resistance due to the body having relatively high resistivity (ranging from several hundred to several throusand ohm/square) and having one terminal of the VVC coupled to ground (the semiconductor body.) However, in VCXOs utilizing a VVC, it is preferable to have both terminals of the VVC isolated from ground for maximum circuit flexiblity in determining VCXO center frequency. Further, a low series resistance for the VVC gives the best frequency stability and highest frequency performance. To achieve this, the VVC is physically separated from the oscillator circuitry and is usually a hyper-abrupt p-n junction diode. Even though it is possible for such a diode to be integrated with the oscillator circuitry, the processing steps necessary for the fabrication of the diode are not readily compatible with the processing steps utilized to fabricate the oscillator circuitry; extra processing steps are required which increases the cost of the fabrication thereof to such an extent that VCXOs constructed with the hyper-abrupt diode in the same semiconductor body as the oscillator circuitry costs more than separate VVC and oscillator circuitry designs. Another type of VVC is a conventional MOS transistor with one terminal being the gate electrode thereof and the other terminal being the drain or source (or both) electrodes thereof. Operation of such a VVC is similar as that described above. However, the capacitance variation possible with this structure is usually insufficient for variable oscillators except those operating over a very narrow frequency range, making them unsuitable for general purpose VCOs or VCXOs.

SUMMARY OF THE INVENTION

A primary object of this invention is to provide a VVC capable of large capacitance variations, integrateable into a common semiconductor body with the oscillator circuitry and not having a terminal of the VVC coupled to the body, fabricated using substantially the same processing steps required for the fabrication of the oscillator circuitry. A further object is to provide a VVC structure having predictable characteristics necsessary for achieving a predetermined series resistance, theshold voltage, minimum capacitance and maximum to minimum capacitance variation. These and other objects of this invention are accomplished by having a VVC formed in a common semiconductor body with the oscillator circuitry and having two terminals, characterized by: a well formed in the semiconductor body and having a second conductivity type different from that of the body; at least one region formed into the well and having the same conductivity type as the well but with a lower resistivity; an insulating material of predetermined thickness disposed over the well and each region; a conductive layer, disposed over the insulating material; wherein each region is interconnected to form a first one of the two terminals and the conductive layer forms a second one of the two terminals. Further, each region forms a closed elongated ring, with a predetermined length and width, having an inner edge and an outer edge with the conductive layer disposed over the ring and extending at least to the inner edge of the ring.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
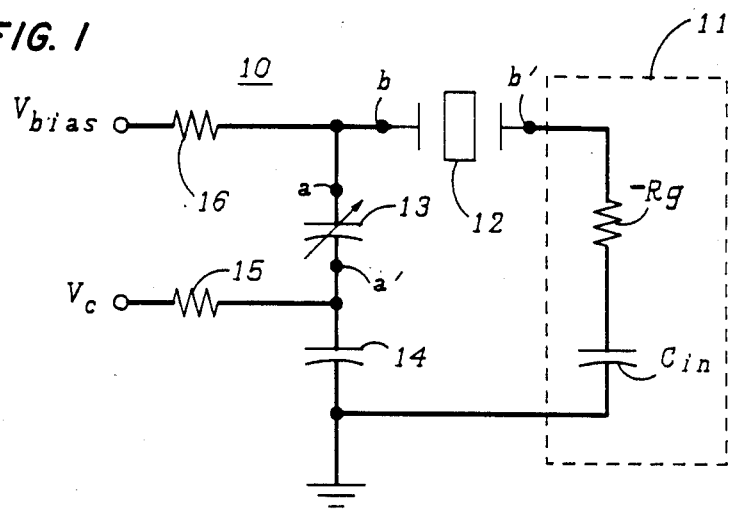
FIG. 1 is schematic diagram of a voltage controlled varaible frequency crystal oscillator utilizing a negative impedance element.
Figure 2B:
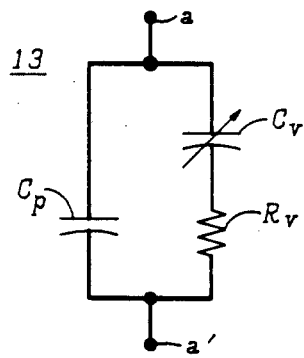
FIG. 2A and 2B are the electrical equivalent circuits for a crystal resonator and a voltage variable capacitor, respectively.
Figure 2A:
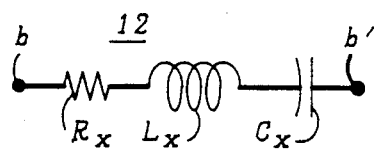

A voltage controlled crystal oscillator 10 is diagrammed in FIG. 1. Negative impedance element 11, which will be discussed in more detail below, provides the necessary gain for oscillation to occur at a frequency essentially determined by crystal resonator 12. A voltage variable capacitor (VVC) 13, disposed in series with the negative impedance element 11 and the crystal 12, allows small, controlled deviations from the resonant frequency of the crystal 12. The VVC 13 varies its capacitance in response to voltage across its terminals a, a'. This voltage is developed by the difference between a control voltage, Vc, and a bias voltage, Vbias, coupled to the VVC 13 by resistors 15 and 16. The bias voltage, Vbias, generated by a voltage source (not shown,) biases the VVC 13 to provide a predetermined frequency of oscillation from oscillator 10 with a predetermined control voltage. Typically, Vbias is set such that the predetermined control voltage is the center of the control voltage range Vc can vary over to adjust the oscillation frequency. Further, though not discussed in detail here, Vbias can vary to compensate for adjustments to Vc that would be necessary to maintain a constant output frequency with temperature or manufacturing variations of the oscillator 10. The capacitor 14 is used for bypassing and, for purposes here, does not have any appreciable effect on the oscillation frequency of oscillator 10. It is noted that the negative impedance element 11 is used here as a general representative of gain-plus-feedback arrangements typical of such oscillators 10. In the preferred embodiment, the negative impedance element 11 is a Colpitts type of oscillator (a split capacitive feedback arrangement in combination with a gain device such as a bipolar transistor or FET,) but other types of feedback arrangements and circuit designs are also suitable. However, for purposes here, such feedback arrangements are modeled as a negative resistance −Rg in series with a reactive component, here a capacitor Cin. As will be discussed in more detail below and for purposes here, the values of the negative resistance −Rg and the capacitor Cin varies as a function of frequency. Referring temporarily to FIG. 2A, a simplified electrical model of the crystal 12 (FIG. 1) is shown. Although other models exist for crystal resonators, this model is sufficiently accurate for analytical purposes here. The resonant frequency of the crystal 12 is primarily determined by the combined reactances of inductor Lx and capacitor Cx. Resistor Rx extablishes the quality, or "Q", of the crystal 12. Typical values for the resistor Rx is 5 to 20 ohms (for an AT cut crystal oscillating at frequencies above 10 MHz) and is determined by the type and frequency of desired operation of the crystal 12. Referring temporarily to FIG. 2B, a simplified electrical model of the VVC 13 (FIG. 1) is shown. Capacitor Cp represents a fixed, or parasitic, capacitance inherent in the VVC 13 and wiring thereto. Capacitance Cv represents the variable capacitance which varies in capacitance in response to the voltage impressed across the terminals a, a'. The characteristics and structure of capacitor Cv will be discussed in more detail below, but it is sufficient to state here that the capacitance of capacitor Cv generally decreases monotonically with increasing voltage across the terminals a, a' and increases monotonically with decreasing voltage. Further, there are threshold and saturation voltages (not to be confused with threshold and saturations voltages relating to transistor physics) associated with the capacitor Cv such that, for purposes here, for voltages applied to the VVC 13 below the threshold voltage or above the saturation voltage, no significant capacitance change occurs in Cv. Also, as will be discussed in detail below, the threshold voltage and saturation voltages are shifted to predetermined voltages by implanting impurities, known as channel implanting, into a portion of the VVC 13. Registor Rv establishes the "Q" of VVC 13. It is generally desirous to have the "Q" of the VVC 13 as high as possible (small Rv) with a large capacitance ratio between minimum and maximum capacitance combination of capacitors Cp and Cv.

Figure 3:
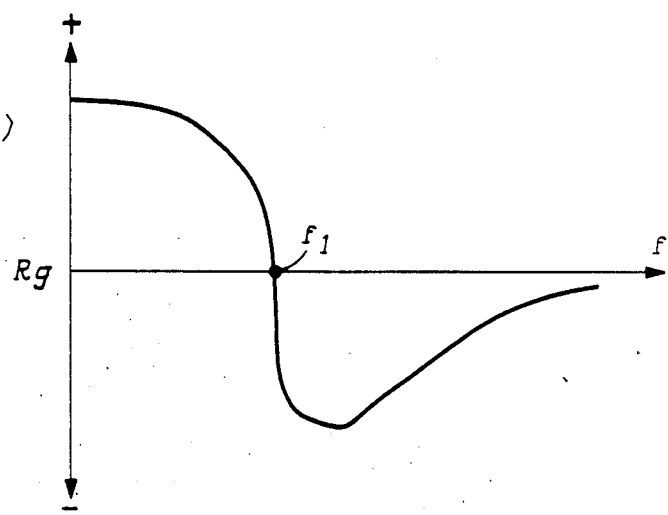
FIG. 3 is an exemplary plot of the resistive portion of the electrical characteristics of the negative impedance element of FIG. 1.

For the circuit of FIG. 1 to oscillate, the resistance of resistor −Rg must be sufficiently negative at the desired oscillation frequency (dictated by the combination of the VVC 13 and the crystal 12) to overcome the combined resistance of the crystal 12 and the VVC 13 for oscillation to occur; the minimum value for −Rg for oscillation is −(Rx+Rv). Typically, −Rg is much larger than this minimum −Rg to guarantee reliable, fast start-up of the oscillator 10. Referring temporarily to FIG. 3, the equivalent resistance (Rg of FIG. 1) of a Colpitts type of oscillator is plotted verses frequency. It is noted that above frequency f1, the resistance of Rg becomes negative and decays toward zero as the operating frequency is increased. Therefore, for the oscillator 10 to operate reliably at high frequencies where Rg approaches zero, the resistivity of the crystal resonator 12, Rx (FIG. 2A,) and the VVC 13, Rv (FIG. 2B,) must be kept to a minimum. As discussed above, Rx is determined by the type and frequency of the desired operation of the crystal 12. Therefore, the resistance of Rv becomes the limiting factor to the upper frequency limit of the oscillator 10 and must be minimized.

Figure 4:
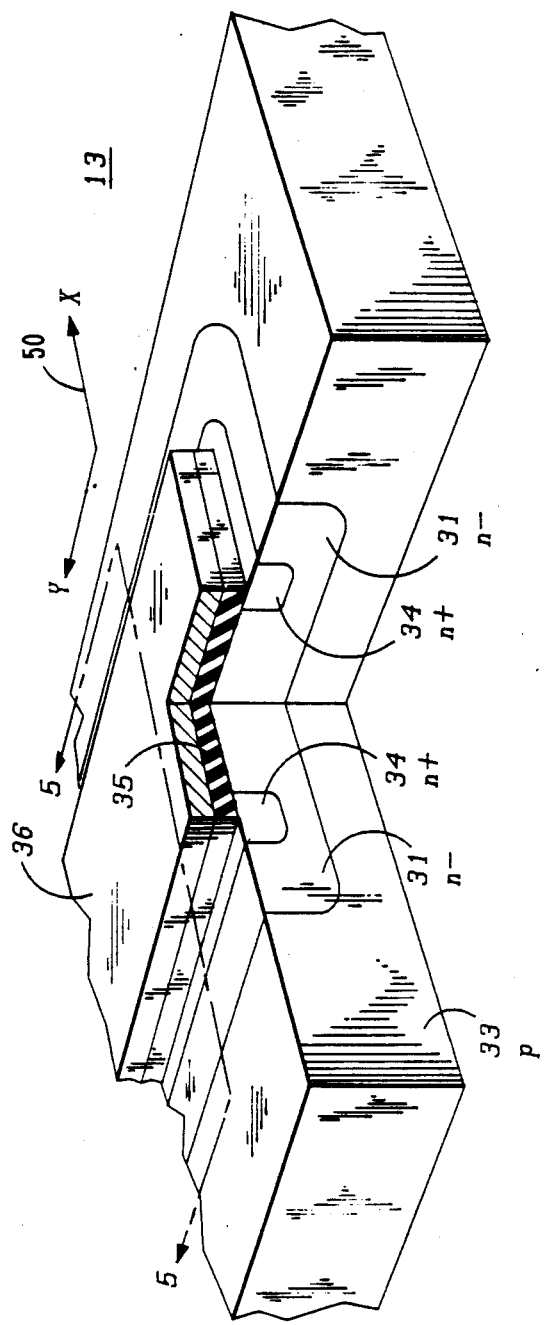
FIG. 4 is an isometric view of the voltage variable capacitor according to the invention.

Referring to FIG. 4, an isometric view and cut-away of the structure of the VVC 13 (FIG. 1) according to the present invention is shown. Here, an n type well 31 is formed into a p type substrate or epitaxial layer (body) 33. Although only a p type body 33 is shown, any type of epitaxial layer could be used, such as in twin-tub CMOS technology. Further, it is noted that the conductivity types given here are for illustrative purposes and the p and n type materials may be interchanged with a corresponding change in applied voltages. A low resistivity elongated region 34, forming a rectangular ring, is formed in the well 31. The width of the ring is much smaller than the inner dimensions of the ring and serves essentially as a very low resistance contact to the well 31. Although the region 34 is shown illustratively as a rectangle, it is obvious that other topographical forms of the ring can be utilized, e.g., an oval. A dielectric layer 35, typically silicon dioxide used for the gate dielectric of transistors (not shown) simultaneously formed in the body 33, is disposed over the well 31 and the region 34. Next a conductive layer 36, typically polysilicon used for the gates of the above mentioned transistors, is deposited over the dielectric 35. The layer 36 is a first one of the two terminals a, a' of the VVC 13 (FIGS. 1, 2B) and the region 34 forms the second of the two terminals. The region 34 can be envisioned as a low resistance contact to the "movable" plate analogy of VVC 13 (FIGS. 1, 2B) while the layer 36 forms the "fixed" plate thereof.

Figure 5:
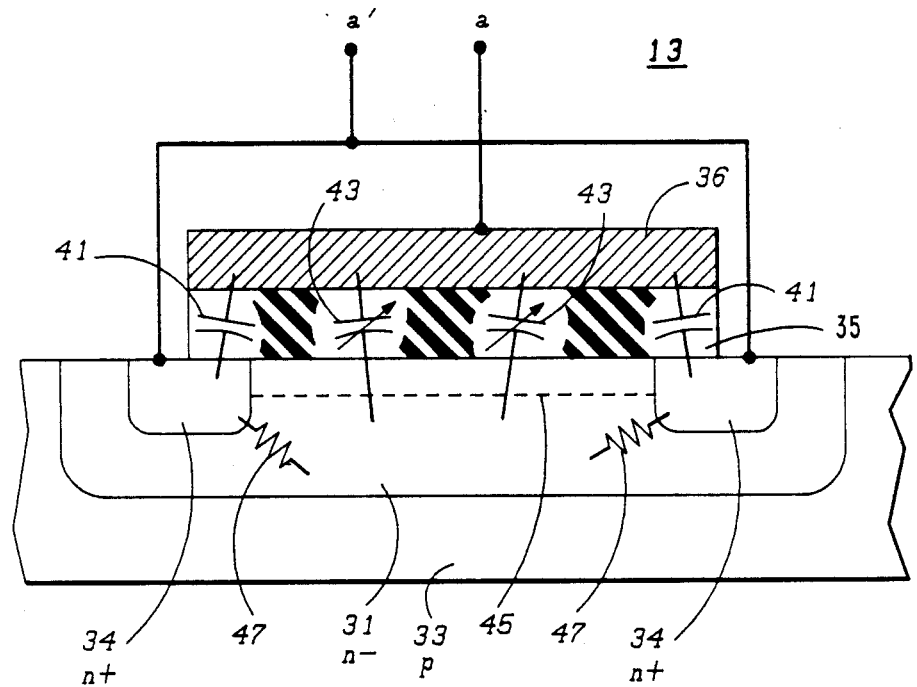
FIG. 5 is a representative cross-sectional diagram of the voltage variable capacitor according to the invention, shown in FIG. 4 and taken along the line 5—5, showing the source of the electrical equivalent circuit of FIG. 2B; and, FIG. 6A and 6B are electrical characteristics of the voltage variable capacitor according to the invention.
Figure 6B:
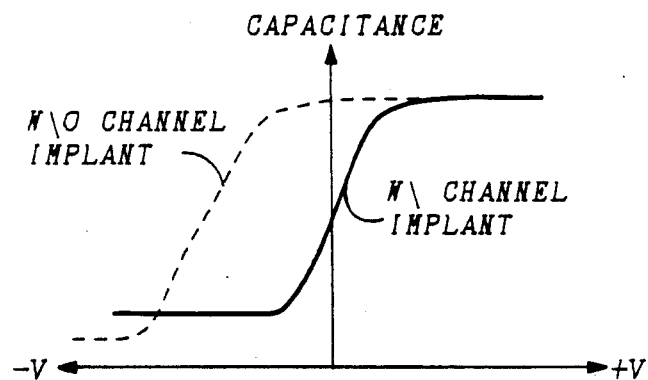
Figure 6A:
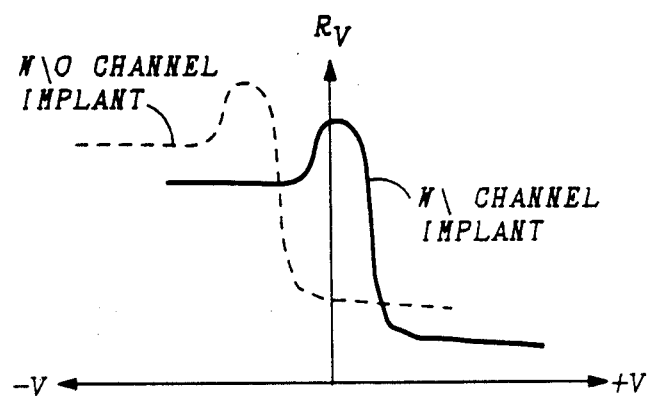

Referring to FIG. 5, a cut-away view of the structure in FIG. 4 along line 5—5 and not to scale, the operation of the VVC 13 is demonstrated showing the correspondence between the electrical model in FIG. 2B and the physical device structure of FIG. 4. As discussed above, the region 34, shown here coupled together, forms one terminal, a', of VVC 13 (FIG. 2B), and layer 36 forms the other terminal, a. Fixed capacitors 41, corresponding to the fixed capacitor Cp in FIG. 2B, are formed between the layer 36 and the region 34, representing the parasitic capacitance in the structure. Variable capacitors 43, corresponding to the variable capacitor Cv in FIG. 2B, are formed between the layer 36 and the lower edge of the depletion layer 45 in the bulk of the well 31 beneath the layer 36. As noted above, the width of the region 34 is much smaller than the inner dimensions of the ring formed by the region 34, and hence that of the layer 36. Therefore, the relative combined capacitance of capacitors 41 is much smaller than the combined capacitance of variable capacitors 43. As discussed above, operation of the variable capacitors 43 is well understood and explained in detail in "Device Electronics for Integrated Circuits", pp. 314–317, but for purposes here, the capacitance thereof varies with the voltage applied to the terminals a, a' due to the edge of a depletion layer 45 varying in distance from the layer 36 in proportion to the applied voltage. The maximum capacitance of Cv occurs when no depletion layer 45 exists and the surface of the well 31 under layer 36 is accumulated (the applied voltage to the VVC 13 is below the above-mentioned threshold voltage.) The minimum capacitance of Cv occurs just before the depletion layer 45 inverts; the surface of the well 31 under the layer 36 becomes conductive again when the applied voltage exceeds the saturation voltage. The resistance of the well 31, depicted by resistors 47 and corresponding to resistor Rv of FIG. 2B, represents the resistance of the coupling between the region 34 and the edge of the depletion layer 45. It is understood that the resistance Rv varies with the voltage on the terminals a, a', corresponding to the plot in FIG. 6A. Further, as is known and desired, the capacitance Cv in combination with the capacitance Cp varies with voltage across terminals a, a' and is plotted in FIG. 6B for high frequencies (more than one megahertz.) The dashed curves in FIGS. 6A and 6B represent the characteristics of the VVC 13 as shown in FIGS. 4 and 5. However, during the manufacture of the transistors (not shown) in the body 33, impurities (not shown) are introduced into the surface of the well 31, commonly known as a channel implant (not shown,) to adjust the threshold voltage of the transistors to a predetermined voltage. This implant also shifts the resistance and capacitance characteristics shown in FIGS. 6A and 6B, from that as represented by the dashed curves to that represented by the solid curves. However, it is understood that these curves are representative curves and vary with the implant types and levels.

Referring again to FIG. 4, the design of the VVC 13 is described as follows. Coordinates 50 indicate the orientation of the VVC 13 and will be used as a reference in describing the physical dimensions of the VVC 13 and it is understood that the coordinates can be interchanged. For purposes here, the conductive layer 36 has a width of x units and a length of y units, usually measured in microns, and y is greater than x. As discussed above, it is desirous to have the series resistance Rv and parasitic capacitance Cp (FIGS. 2B and 5) as small as practical and have as large as possible variation in capacitance. To remain compatible with the processing steps for the fabrication of the oscillator circuitry (not shown) into the body 33, the dopings, and hence the resistivity, of well 31 and the region 34 are fixed. Further, the thickness of the dielectric 35 is also similarly fixed. As noted above, the width of region 34 is much less than either the x or y dimension of the layer 36 and is preferably the minimum feature size possible. With these constraints, the capacitance Cp varies proportionally with the circumference of the layer 36, i.e., it is proportional to $2(x+y)$, while the resistance Rv varies proportionally to the ratio of the length to width, i.e., proportional to $x/y$. Further, the maximum capacitance of variable capacitor Cv varies proportional to the area of the layer 36, i.e., proportional to $xy$. Therefore, to minimize the resistance Rv, y should be much larger than x, such as y being ten times that of x. Further, with y much larger than x, the parasitic capacitance Cp is then dependent on y; the contribution by the x portion is negligible compared to the y contribution. However, the maximum capacitance of Cv remains proportional to x. Exemplary VVC 13 specifications for two devices fabricated in a 1000 ohm/square n type well 31, a 10 ohm/square n+ region 34, the region 34 being one micron thick and 250 angstrom thick oxide 35, are:

| | | |
|---|---|---|
| x | 17 microns | 11 microns |
| y | 660 microns | 880 microns |
| Rv | 10 ohms | 5 ohms |
| Combined capacitance of Cv and Cp (minimum) | 3.5 pF | 5 pF |

| | -continued | |
|---|---|---|
| (ratio maximum/minimum) | 4.88 | 4 |

It is possible to combine multiple VVCs 13 to increase the resulting capacitance or allow multiple control voltages to affect the oscillation frequency. Should multiple VVCs 13 be desired but utilizing only one control signal, the multiple VVCs 13 may be disposed in a single well 31.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

What is claimed is:

1. A voltage variable capacitor formed in a semiconductor body of a first conductivity type and having two terminals, characterized by:
    a well formed in the body and having a second conductivity type different from that of the body;
    at least one conductive region formed into a portion of the major surface of the well and having the same conductivity type as the well but with a lower resistivity;
    an insulating material of predetermined thickness disposed over the well and a portion of the conductive region;
    a conductive layer disposed over the insulating material and the portion of the conductive region covered by the insulating material;
    wherein the uncovered portion of the conductive region has attached thereto a first one of the two terminals and the conductive layer has attached thereto a second one of the two terminals.

2. The voltage variable capacitor recited in claim 1, wherein the conductive region forms a closed elongated ring, having an inner and an outer edge, with a major axis dimension of y units and a minor axis dimension of x units measured from the inner edge of the ring.

3. The voltage variable capacitor recited in claim 2, wherein the conductive layer is disposed symmetrically over the ring.

4. The voltage variable capacitor recited in claim 3, wherein the conductive layer extends at least to the inner edge of the ring.

5. The voltage variable capacitor recited in claim 4, wherein y is at least ten times that of x.

6. The voltage variable capacitor recited in claim 5, wherein the closed ring is rectangular.

7. The voltage variable capacitor recited in claim 6, wherein the resistivity of the well is greater than 100 ohms/square and the resistivity of each region is less than 100 ohms/square.

8. The voltage variable capacitor recited in claim 7, wherein the semiconductor of the second conductivity type is N type semiconductor.

9. The voltage variable capacitor as recited in claim 8, wherein the semiconductor of the first type is P type semiconductor.

10. An oscillator for producing a variable frequency signal, varying in response to a control signal, having in combination:
    a negative impedance element;
    a frequency determining network; and
    a voltage variable capacitor;
    wherein the voltage variable capacitor is formed in a semiconductor body of a first conductivity type, has two terminals, and is characterized by:
    a well formed in the body and having a second conductivity type different from that of the body;
    at least one conductive region formed into a portion of the major surface of the well and having the same conductivity type as the well but with a lower resistivity;
    an insulating material of predetermined thickness disposed over the well and a portion of the conductive region;
    a conductive layer disposed over the insulating material and the portion of the conductive region covered by the insulating material;
    wherein the uncovered portion of the conductive region has attached thereto a first one of the two terminals and the conductive layer has attached thereto a second one of the two terminals.

11. The oscillator, as recited in claim 10, wherein the frequency determining network is a crystal.

* * * * *